(12) United States Patent
Sasaki et al.

(10) Patent No.: US 7,646,581 B2
(45) Date of Patent: Jan. 12, 2010

(54) ELECTROSTATIC CHUCK

(75) Inventors: Yasuharu Sasaki, Nirasaki (JP); Takehiro Ueda, Nirasaki (JP); Yusuke Nakagawa, Nirasaki (JP); Nobuyuki Nagayama, Nirasaki (JP); Taketoshi Okajo, Nirasaki (JP); Mamoru Kosakai, Narashino (JP)

(73) Assignees: Sumitomo Osaka Cement Co., Ltd. (JP); Tokyo Electron Limited (JP)

( * ) Notice: Subject to any disclaimer, the term of this patent is extended or adjusted under 35 U.S.C. 154(b) by 0 days.

(21) Appl. No.: 11/668,568

(22) Filed: Jan. 30, 2007

(65) Prior Publication Data

US 2007/0217114 A1    Sep. 20, 2007

Related U.S. Application Data

(60) Provisional application No. 60/775,892, filed on Feb. 23, 2006.

(30) Foreign Application Priority Data

Jan. 31, 2006   (JP) ............................. 2006-022381

(51) Int. Cl.
    *H01L 21/683* (2006.01)
(52) U.S. Cl. ..................................... 361/234
(58) Field of Classification Search ................. 361/234
    See application file for complete search history.

(56) References Cited

U.S. PATENT DOCUMENTS

| 5,563,683 | A | * | 10/1996 | Kamiya ....................... 355/53 |
| 5,903,428 | A | * | 5/1999 | Grimard et al. ............. 361/234 |
| 5,923,408 | A | * | 7/1999 | Takabayashi ................. 355/53 |
| 6,768,627 | B1 | * | 7/2004 | Kitabayashi et al. ........ 361/234 |
| 6,905,984 | B2 | * | 6/2005 | Kellerman et al. .......... 438/597 |
| 7,113,262 | B2 | * | 9/2006 | Van Empel et al. ........... 355/72 |
| 7,292,426 | B2 | * | 11/2007 | Ito et al. ..................... 361/234 |
| 2002/0036373 | A1 | * | 3/2002 | Kosakai ....................... 269/21 |
| 2003/0123213 | A1 | * | 7/2003 | Kosakai ...................... 361/234 |
| 2005/0152088 | A1 | * | 7/2005 | Ito et al. ..................... 361/233 |

FOREIGN PATENT DOCUMENTS

| JP | 3176305 | 4/2001 |
| JP | 2006-049352 | 2/2006 |

* cited by examiner

*Primary Examiner*—Danny Nguyen
*Assistant Examiner*—Tien Mai
(74) *Attorney, Agent, or Firm*—Ostrolenk Faber LLP (57) ABSTRACT

An electrostatic chuck capable of widening a temperature range and reducing a variation in thermal conductivity between the electrostatic chuck and the flat substrate over time is provided. The chuck includes: a body that has an internal electrode for attracting a flat substrate by an electrostatic force provided therein, a plurality of protrusions formed on one surface of the body serving as an electrostatic attraction surface, and projections provided on the top surfaces of some or all of the plurality of protrusions. In the electrostatic chuck, a region of the top surface of each of the minute projections on which the flat substrate is loaded is referred to as a mounting surface, and the total area of the mounting surfaces of the minute projections is equal to or larger than 0.01% and equal to or smaller than 2% of the area of the electrostatic attraction surface.

11 Claims, 7 Drawing Sheets

FIG. 13   PRIOR ART

ELECTROSTATIC CHUCK

This application claims priority to and the benefit of Japanese Patent Application No. 2006-022381, filed on Jan. 31, 2006, and U.S. Provisional Patent Application No. 60/775,892, filed on Feb. 23, 2006, the entire contents of which are hereby incorporated by reference as if fully set forth herein.

BACKGROUND OF THE INVENTION

1. Field of the Invention

The present invention relates to an electrostatic chuck used to fix a flat substrate (flat test sample), such as a semiconductor wafer, a metal wafer, or a glass plate, that is used to manufacture a liquid crystal display (LCD) and semiconductor devices, such as IC, LSI, and VLSI.

2. Description of Related Art

In the related art, in a method of manufacturing a semiconductor device or a liquid crystal display device, various processes are performed on the surface of a flat substrate, such as a semiconductor wafer, a metal wafer, or a glass plate. During these processes, in order to fix the flat substrate using an electrostatic attraction force and keep the flat substrate at a constant temperature, electrostatic chucks having various structures have been proposed (for example, Patent Document 1 (Japanese Patent No. 3176305)).

Figure 13:
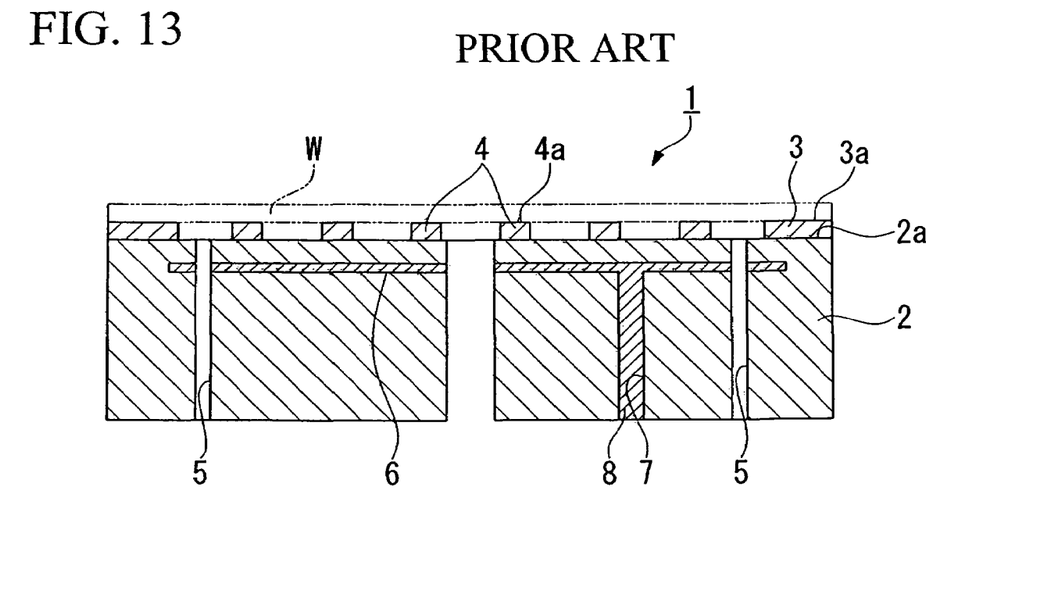
FIG. 13 is a cross-sectional view illustrating an example of a susceptor device according to the related art.

FIG. 13 is a cross-sectional view illustrating an example of an electrostatic chuck according to the related art. In an electrostatic chuck 1, a ring-shaped circumferential wall 3 having a predetermined width and height is provided in a circumferential portion of a surface 2a of an electrostatic chuck body 2 that is formed of an insulating material, and a plurality of columnar protrusions 4 having the same height as the circumferential wall 3 are provided on the surface 2a inside the circumferential wall 3. A roughening process is performed on top surfaces 4a of the columnar protrusions 4, that is, contact surfaces of the columnar protrusions 4 with a flat substrate W such that a surface roughness Ra (centerline average roughness) is in the range of 0.35 μm to 3.0 μm, and the flat substrate W is supported by the top surface 3a of the circumferential wall 3 and the top surfaces 4a of the columnar protrusions 4.

A cooling gas introduction hole 5 is formed in the electrostatic chuck body 2 in the thickness direction thereof, and an internal electrode 6 for generating an electrostatic attraction force is arranged in parallel to the surface 2a. When a voltage is applied to the internal electrode 6 through a lead electrode 8 provided in an electrode insertion hole 7, the flat substrate W is attracted to the electrostatic chuck by an electrostatic force, and the temperature of the flat substrate W is maintained at a constant value by a cooling gas flowing through the cooling gas introduction hole 5.

In recent years, a so-called waferless dry-cleaning process of cleaning the inside of a reaction chamber before a flat substrate is fixed to an electrostatic attraction surface by an electrostatic attraction force has been performed on apparatuses using plasma, such as a plasma CVD apparatus, a plasma etching apparatus, a sputtering apparatus, and an ion injection apparatus, particularly, on the plasma etching apparatus, in order to remove foreign materials or particles from the electrostatic attraction surface of an electrostatic chuck provided in the apparatus.

However, in the electrostatic chuck 1 according to the related art, as the number of flat substrates W processed increases, the top surfaces 4a of the columnar protrusions 4 of the electrostatic chuck body 2 are worn away due to contact with the flat substrate W, and the states of the top surfaces 4a of the columnar protrusions 4 vary over time, which makes it difficult to keep uniform contact between the top surfaces 4a and the flat substrate W.

In this case, thermal conductivity between the electrostatic chuck body 2 and the flat substrate W varies over time, which makes it difficult to keep the flat substrate W at a constant temperature. As a result, it is difficult to process each flat substrate W under the same condition.

In addition, particles are likely to be inserted into a gap between the top surfaces 4a of the columnar protrusions 4 and the contact surface of the flat substrate W. When the particles are inserted into the gap, the electrostatic attraction force is weakened, and the sealing of a cooling gas deteriorates.

Meanwhile, since the surface of the electrostatic chuck on which the flat substrate is loaded is directly exposed to plasma during the waterless dry-cleaning process, the state of the mounting surface varies over time as the number of waferless dry-cleaning processes increases. As a result, the contact state of the mounting surface with the flat substrate varies, and the thermal conductivity between the mounting surface of the electrostatic chuck and the flat substrate varies over time, which makes it difficult to keep the flat substrate at a constant temperature and thus to process each flat substrate under the same condition.

Further, since the uniformity of the internal temperature of the flat substrate is lowered, it is difficult to uniformly process the entire surface of the flat substrate, and particles are likely to be generated.

Therefore, the inventors have proposed an electrostatic chuck that, even when a flat substrate is repeatedly loaded on the electrostatic chuck and the time required to perform a waferless dry-cleaning process is lengthened, can prevent a large variation in thermal conductivity between the electrostatic chuck and the flat substrate over time, prevent particles from being generated, prevent particles from being adhered to the rear surface of the flat substrate, have a uniform electrostatic attraction force, and prevent the flat substrate from being separated after the application of voltage stops (see Japanese Patent Application No. 2004-223995).

In the electrostatic chuck, a plurality of protrusions are provided on one surface of a body, and a plurality of minute projections are provided on each of the top surfaces of the protrusions. In addition, the top surface of each of the minute projections is referred to as a mounting surface on which the flat substrate is loaded, and the total area of the plurality of minute projections is equal to or larger than 1% and equal to or smaller than 40% of the area of the top surface of the protrusion.

In the electrostatic chuck, the flat substrate is loaded on the mounting surfaces, which are top surfaces, of the minute projections provided on the top surfaces of the protrusions. Therefore, even when the flat substrate is repeatedly loaded on the electrostatic chuck and the time required to perform the waferless dry-cleaning process is lengthened, it is possible to prevent thermal conductivity between the electrostatic chuck and the flat substrate from varying over time.

However, in the electrostatic chuck, it is also preferable to widen a temperature range in which the temperature of the flat substrate can be maintained at a constant value by controlling the pressure of a cooling gas and to reduce a variation in thermal conductivity between the electrostatic chuck and the flat substrate overtime.

SUMMARY OF THE INVENTION

The present invention provides an electrostatic chuck capable of widening a temperature range in which the temperature of a flat substrate can be maintained at a constant value by controlling the pressure of a cooling gas (hereinafter, referred to as 'accurately controlling the temperature of a flat substrate') and reducing a variation in thermal conductivity between the electrostatic chuck and the flat substrate over time.

According to an aspect of the invention, an electrostatic chuck includes: a body that has an internal electrode for attracting a flat substrate by an electrostatic force provided therein; a plurality of protrusions that are formed on one surface of the body, serving as an electrostatic attraction surface; and one or more minute projections that are provided on each of top surfaces of some or all of the plurality of protrusions. In the electrostatic chuck, a region of the top surface of each of the minute projections on which the flat substrate is loaded is referred to as a mounting surface, and the total area of the mounting surfaces of the minute projections is equal to or larger than 0.01% and equal to or smaller than 2% of the area of the electrostatic attraction surface.

That is, in the electrostatic chuck according to the above-mentioned aspect, the electrostatic attraction surface is formed on one surface of the body having the internal electrode for attracting the flat substrate by an electrostatic force provided therein, a plurality of protrusions are provided on the electrostatic attraction surface, and one or more minute projections are provided on each of the top surfaces of some or all of the plurality of protrusions. In addition, a region of the top surface of each of the minute projections on which the flat substrate is loaded is referred to as a mounting surface, and the total area of the mounting surfaces of the minute projections is equal to or larger than 0.01% and equal to or smaller than 2% of the area of the electrostatic attraction surface.

In the electrostatic chuck according to the above-mentioned aspect, the term 'electrostatic attraction surface' means a region (surface) on which the flat substrate is actually loaded, in the entire surface of the body having the internal electrode for attracting the flat substrate by an electrostatic force provided therein. For example, when the entire surface of the body is covered with the flat substrate, the entire surface of the body is referred to as the electrostatic attraction surface. When the entire surface of the body is not covered with the flat substrate, a portion of the surface covered with the flat substrate is referred to as the electrostatic attraction surface.

In the electrostatic chuck according to the above-mentioned aspect, the term 'region coming into contact with the flat substrate' means a region corresponding to the area of a cut portion that is cut parallel to the top surface of the protrusion at a height corresponding to 50% of the height from the top surface of each protrusion to the top (the highest point) of the minute projection provided on the protrusion.

In the electrostatic chuck according to the above-mentioned aspect, one or more minute projections are provided on each of the top surfaces of some or all of the plurality of protrusions, and when the flat substrate is loaded on the top surfaces of the minute projections, a region of each of the top surfaces of the minute projections contacting the flat substrate is referred to as a mounting surface. In this case, the total area of the mounting surfaces of the minute projections is equal to or larger than 0.01% and equal to or smaller than 2% of the area of the electrostatic attraction surface, which makes it possible to widen a temperature range when the temperature of the flat substrate is maintained at a constant value by controlling the pressure of a cooling gas. Therefore, even when the flat substrate is repeatedly loaded on the electrostatic chuck and the time required to perform the waterless dry-cleaning process is lengthened, it is possible to prevent thermal conductivity between the electrostatic chuck and the flat substrate from varying over time.

In the electrostatic chuck according to the above-mentioned aspect, preferably, the area of the mounting surface of the minute projection is equal to or larger than $2 \times 10^{-3}$ mm$^2$ and equal to or smaller than 0.8 mm$^2$.

According to the above-mentioned structure, when the area of the mounting surface of the minute projection is smaller than $2 \times 10^{-3}$ mm$^2$, the top surfaces of the minute projections are likely to be worn away due to the flat substrate. In particular, when a waterless dry-cleaning process is performed on the electrostatic attraction surface, a long processing time is required, and the side of each minute projection is mainly etched by plasma. As a result, the minute projections are worn out.

Meanwhile, when the area of the mounting surface of the minute projection is larger than 0.8 mm$^2$, a difference in thermal conductivity occurs between contact portions between the minute projections and the flat substrate and non-contact portions, which makes the internal temperature of the flat substrate non-uniform.

In the electrostatic chuck according to the above-mentioned aspect, preferably, the height of the minute projection from the top surface of the protrusion is equal to or larger than 1 μm and equal to or smaller than 10 μm.

In the electrostatic chuck, when the height of the minute projection from the top surface of the protrusion is smaller than 1 μm, the height of the minute projection is reduced due to contact between the minute projection and the flat substrate, and the abrasion of the minute projections is accelerated.

Meanwhile, when the height of the minute projection from the top surface of the protrusion is larger than 10 μm, the electrostatic attraction force is weakened, and manufacturing costs increase.

In the electrostatic chuck according to the above-mentioned aspect, preferably, the height of the minute projection from the one surface of the body is equal to or larger than 10 μm and equal to or smaller than 60 μm.

In the electrostatic chuck, when the height of the minute projection from the one surface of the body is smaller than 10 μm, the flat substrate is likely to come into contact with one surface of the body, that is, flat portions between the protrusions. Meanwhile, when the height of the minute projection from the one surface of the body is larger than 60 μm, the electrostatic attraction force is weakened.

In the electrostatic chuck according to the above-mentioned aspect, preferably, the area of the mounting surface of the minute projection is equal to or larger than 0.05% and equal to or smaller than 50% of the area of the protrusion.

In the electrostatic chuck, when the area of the mounting surface of the minute projection is smaller than 0.05% of the area of the protrusion, contact pressure between the minute projections and the flat substrate increases, and the minute projections and the flat substrate are worn away. In addition, scratches occur in the flat substrate, which cause particles to be generated.

Meanwhile, when the area of the mounting surface of the minute projection is larger than 50% of the area of the protrusion, it is difficult to control the pressure and flow of a cooling gas to accurately adjust the temperature of a flat substrate, and thermal conductivity between the flat substrate and the mounting surface is lowered due to the particles adhering to the minute projections. As a result, it is difficult for the minute projections provided on each of the top surfaces of the protrusions to sufficiently exhibit their performances.

In the electrostatic chuck according to the above-mentioned aspect, preferably, the total area of the plurality of protrusions is equal to or larger than 15% and equal to or smaller than 60% of the area of the electrostatic attraction surface.

According to the above-mentioned structure, in the electrostatic chuck, when the ratio of the total area of the plurality of protrusions to the area of the electrostatic attraction surface is in the above-mentioned range, it is possible to rapidly fill up a cooling gas into a gap between the body and the flat substrate, and thus to prevent the temperature from being non-uniform due to a difference in the pressure distribution of a cooling gas on the electrostatic attraction surface.

When the total area of the plurality of protrusions is smaller than 15% of the area of the electrostatic attraction surface, it is difficult to obtain a sufficient electrostatic attraction force. When the total area of the plurality of protrusions is larger than 60% of the area of the electrostatic attraction surface, the pressure distribution of a cooling gas becomes non-uniform on the electrostatic attraction surface.

In the electrostatic chuck according to the above-mentioned aspect, preferably, a curved portion having a curvature radius of equal to or larger than 0.5 μm and equal to or smaller than 5 μm is formed in the circumference of the top surface of the minute projection.

According to the above-mentioned structure, in the electrostatic chuck, a curved portion having a curvature radius of equal to or larger than 0.5 μm and equal to or smaller than 5 μm is formed in the circumference of the top surface of the minute projection. Therefore, it is possible to prevent the abrasion of the circumferential portion of each of the minute projections and the generation of particles. As a result, it is possible to prevent the deformation of the top surfaces of the minute projections and a variation in the thermal conductivity between the flat substrate and the mounting surfaces of the minute projections.

In the electrostatic chuck according to the above-mentioned aspect, preferably, the protrusions and the minute projections are formed of a composite sintered material of aluminum oxide and silicon carbide that includes equal to or larger than 1% by weight and equal to or smaller than 12% by weight of silicon carbide. In addition, preferably, the average diameter of aluminum oxide particles is equal to or smaller than 2 μm, and the average diameter of silicon carbide particles is equal to or smaller than 0.2 μm.

According to the above-mentioned structure, in the electrostatic chuck, in the composite sintered material of aluminum oxide and silicon carbide, when the content of silicon carbide is smaller than 1% by weight, the average diameter of silicon oxide particles becomes larger than 2 μm, which causes the composite sintered material of aluminum oxide and silicon carbide to be easily etched by plasma. Meanwhile, when the content of silicon carbide in the composite sintered material of aluminum oxide and silicon carbide is larger than 12% by weight, the resistivity of the body becomes smaller than $1 \times 10^8$ Ω·cm, which makes it difficult to obtain a body having a high insulating performance.

When the average diameter of aluminum oxide particles is equal to or smaller than 2 μm, it is possible to prevent the composite sintered material of aluminum oxide and silicon carbide from being etched by plasma and prevent sputtering marks from being formed.

In addition, when the average diameter of silicon carbide particles is equal to or smaller than 0.2 μm, it is possible to prevent the circumference of each silicon carbide particle from being damaged due to the concentration of an electric field on the silicon carbide particles of the composite sintered material of silicon carbide and aluminum oxide during radiation of plasma.

In the electrostatic chuck according to the above-mentioned aspect, preferably, a wall portion is provided in a ring shape along the circumference of the electrostatic attraction surface, and the flat substrate is loaded on the top surface of the wall portion and the top surfaces of the minute projections.

According to the above-mentioned structure, in the electrostatic chuck, a flat substrate is loaded on the top surfaces of the minute projections and the top surface of the wall portion provided in a ring shape along the circumference of the electrostatic attraction surface. Therefore, it is possible to seal a cooling gas in a gap between the electrostatic attraction surface and the flat substrate.

In the electrostatic chuck according to the above-mentioned aspect, preferably, a step portion is provided in the top surface of the wall portion along the inner circumference of the wall portion, and the flat substrate is loaded on portions of the top surface other than the step portion.

According to the above-mentioned structure, in the electrostatic chuck, the flat substrate is loaded on regions of the top surface of the wall portion other than the step portion. Therefore, it is possible to accurately control the temperature of the flat substrate around the wall portion.

In the electrostatic chuck according to the above-mentioned aspect, preferably, one or more second minute projections are provided on the step portion, and the flat substrate is loaded on the top surfaces of the second minute projections.

According to the above-mentioned structure, in the electrostatic chuck, one or more second minute projections are provided on the step portion, and the flat substrate is loaded on the top surfaces of the second minute projections. Therefore, it is possible to accurately control the temperature of the flat substrate around the wall portion and strengthen the electrostatic attraction force.

In the electrostatic chuck according to the above-mentioned aspect, preferably, a second wall portion is provided in a ring shape on the step portion along the circumference of the step portion, and the flat substrate is loaded on the top surface of the second wall portion.

According to the above-mentioned structure, in the electrostatic chuck, the flat substrate is loaded on the top surface of the second wall portion provided in a ring shape on the step portion along the circumference of the step portion. Therefore, it is possible to accurately control the temperature of the flat substrate around the wall portion and strengthen the electrostatic attraction force.

In the electrostatic chuck according to the above-mentioned aspect, preferably, the height of the second wall portion from the step portion is equal to or larger than 1 μm and equal to or smaller than 10 μm.

According to the above-mentioned structure, in the electrostatic chuck, when the height of the second wall portion from the step portion is smaller than 1 μm, particles are likely to be adhered to the rear surface of a flat substrate, and a large variation in thermal conductivity occurs due to the particles adhered to the rear surface of the flat substrate. Meanwhile, when the height of the second wall portion from the step portion is larger than 10 μm, it is difficult to prevent particles from being adhered to the rear surface of the flat substrate and prevent a variation in thermal conductivity, resulting in a weak electrostatic attraction force. In addition, the minute projections are likely to be deformed during processing, and manufacturing costs increase.

DETAILED DESCRIPTION OF THE INVENTION

Hereinafter, preferred embodiments of an electrostatic chuck according to the invention will be described below.

The embodiments described below are illustrative, but are not limitative of the invention.

First Embodiment

Figure 1:
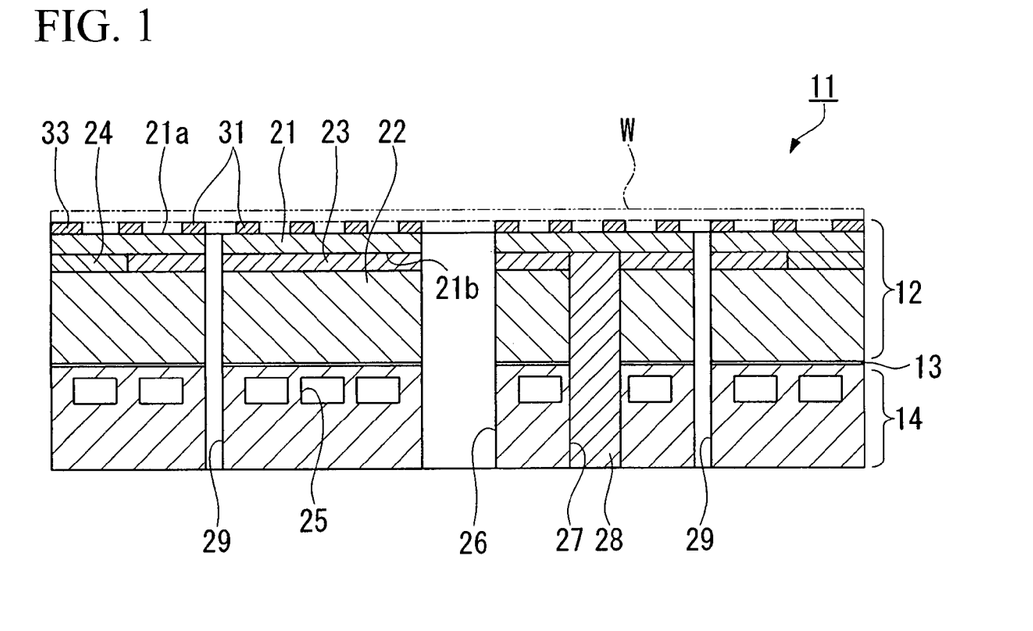
FIG. 1 is a cross-sectional view illustrating an electrostatic chuck according to a first embodiment of the invention.
Figure 2:
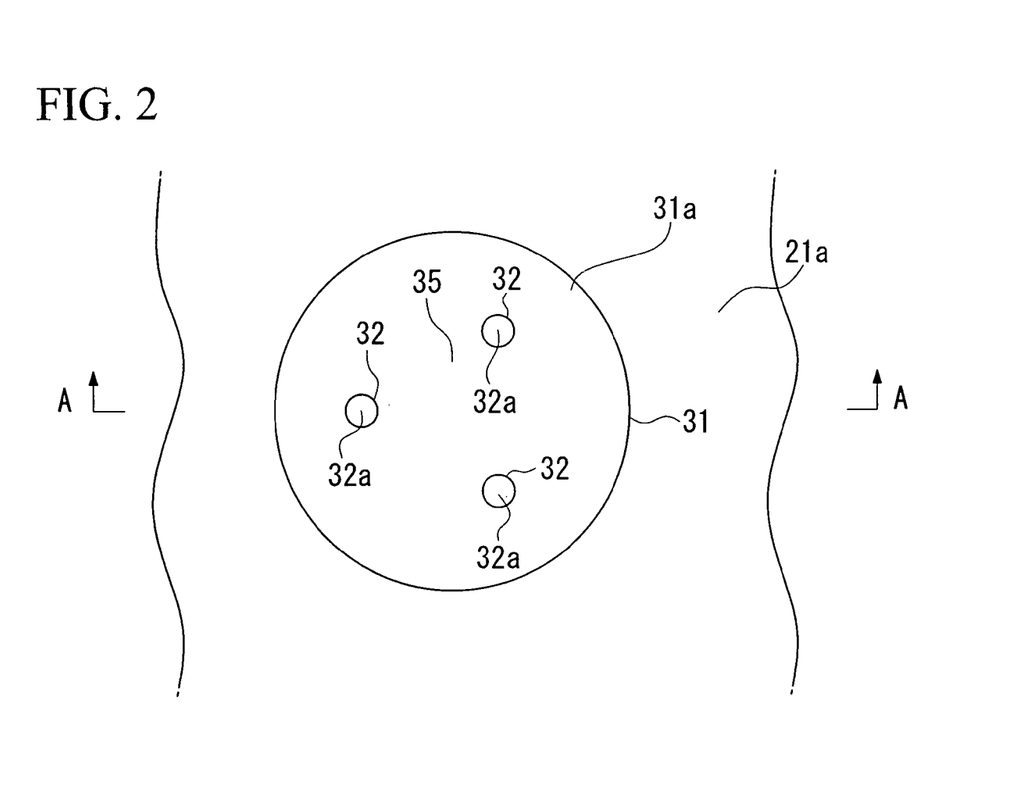
FIG. 2 is an enlarged plan view illustrating the vicinity of a circumferential portion of the electrostatic chuck according to the first embodiment of the invention.
Figure 3:
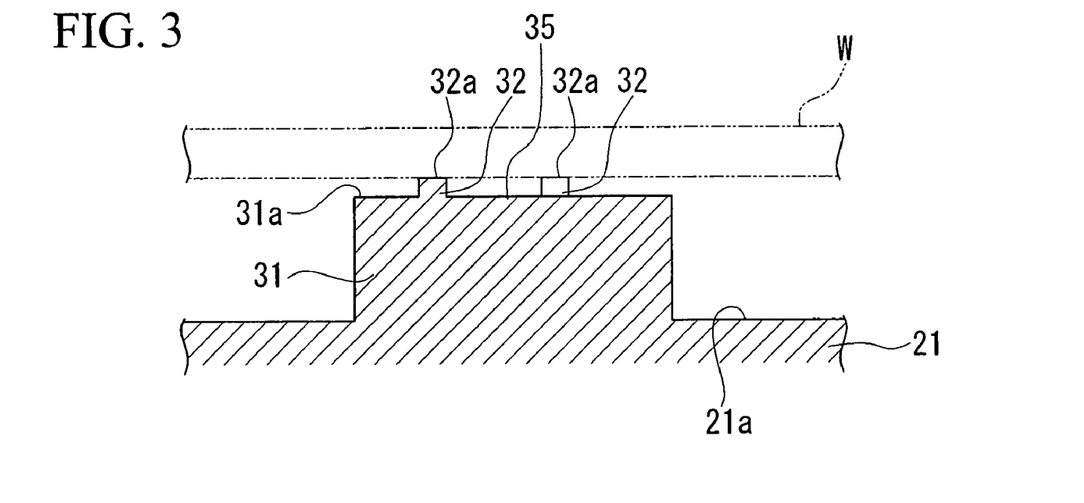
FIG. 3 is a cross-sectional view taken along the line III-III of FIG. 2.

FIG. 1 is a cross-sectional view illustrating an electrostatic chuck according to a first embodiment of the invention, FIG. 2 is an enlarged plan view illustrating the periphery of a circumferential portion of the electrostatic chuck, and FIG. 3 is a cross-sectional view taken along the line II-II of FIG. 2. An electrostatic chuck 11 includes a disk-shaped body 12 and a temperature adjusting base member 14 that is formed of a metallic material and is bonded to a lower surface of the body 12 by a silicon resin adhesive 13.

The body 12 includes a dielectric plate 21 that is an upper surface (one surface 21a) serving as a mounting surface on which a test sample W, such as a semiconductor wafer, a metal wafer, or a glass plate, is loaded, a disk-shaped insulating member 22 that is arranged opposite to a lower surface 21b (the other surface) of the dielectric plate 21, an internal electrode 23, and a ring-shaped insulting member 24 that is arranged to surround the internal electrode 23. The internal electrode 23 and the ring-shaped insulating member 24 are interposed between the dielectric plate 21 and the insulating member 22.

Meanwhile, a flow path 25 for circulating a cooling medium, such as water or organic solvent, is formed in the temperature adjusting base member 14.

A through-hole 26 is formed in the center of the body 12 and the temperature adjusting base member 14 in order to detach the test sample W that is attracted to the dielectric plate 21 by an electrostatic force, and a pressure member (not shown) for pressing the test sample W downward in the drawings passes through the through-hole 26.

An electrode insertion hole 27 is formed in the vicinity of the center of the insulating member 22 and the temperature adjusting base member 14, and a lead electrode 28 for applying a voltage to the internal electrode 23 is filled into the electrode insertion hole 27. The upper end of the lead electrode 28 is electrically connected to the internal electrode 23.

A cooling gas introduction hole 29 is formed in the dielectric plate 21, the insulating member 22, and the internal electrode 23, and the temperature adjusting base member 14 so as to pass through these components. The cooling gas introduction hole 29 supplies a cooling gas, such as He, to a gap between the insulating member 21 and the lower surface of the test sample W.

One flat substrate W is loaded on the upper surface 21a of the dielectric plate 21, and the upper surface 21a of the dielectric plate 21 serves as an electrostatic attraction surface on which the flat substrate W is attracted by an electrostatic attraction force. In addition, a plurality of protrusions 31, each having a substantially circular shape in sectional view, are provided along the circumference of the upper surface 21a (the electrostatic attraction surface) of the dielectric plate 21, and one or more cylindrical minute projections 32 (three minute projections in FIGS. 2 and 3), each having a substantially circular shape in sectional view, are provided on a top surface 31a of each of the protrusions 31. Further, a top surface 32a of each of the minute projections 32 is parallel to the top surface 31a, that is, the upper surface 21a (the electrostatic attraction surface).

The minute projections 32 are not necessarily provided on the top surfaces 31a of all of the protrusions 31, but they may be provided on the top surfaces 31a of some of the protrusions 31, for example, equal to or larger than 10% of the protrusions, preferably, equal to or larger than 30% of the protrusions 31. When the number of protrusions 31 having the minute projections 32 provided thereon is less than 10% of the total number of protrusions 31, it is difficult to obtain the technical effect of providing the projections 32 on the top surface 31a of each of the protrusions 31. Therefore, preferably, more than 10% of the protrusions have the projections 32 on their top surfaces 31a.

The shape of the minute projections 32 is not limited to the cylindrical shape. For example, the minute projections 32 may be formed in a prism shape, a conic shape, or a pyramid shape.

The protrusions 31 each having the minute projections 32 on the top surface may concentrate on the center of the electrostatic attraction surface or the circumferential portion. For example, when the protrusions 31 each having the minute projections 32 on the top surface thereof partially concentrate on the electrostatic attraction surface, it is possible to accurately control the temperature of a flat substrate in the concentrated portion. In addition, the protrusions 31 are not necessarily formed in one stage, but may be formed in two or more stages.

Figure 4:
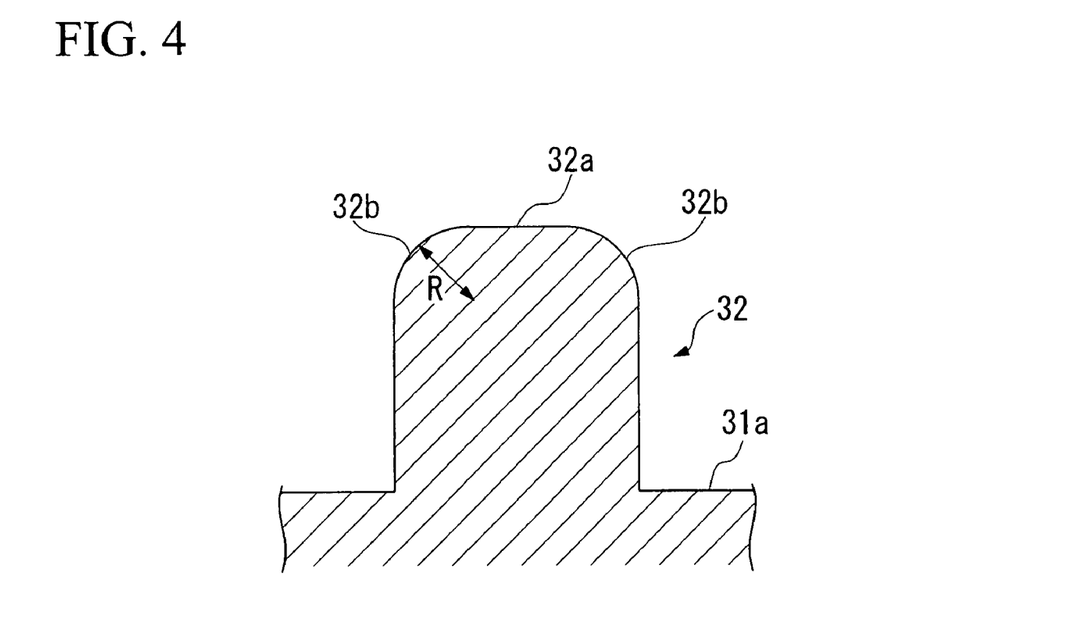
FIG. 4 is a cross-sectional view illustrating a minute projection of the electrostatic chuck according to the first embodiment of the invention.

As shown in FIG. 4, the minute projection 32 includes a flat top surface 32a provided in the center and a curved portion 32b that is formed in the circumference of the top surface 32a to have a curvature radius R, and a portion of the top surface 32a on which the flat substrate W is loaded serves as a mounting surface.

The number of minute projections 32 provided on the top surface 31a of the protrusion 31 is one or more, preferably, in the range of 1 to 20, but is not limited thereto.

A wall portion 33 having the same height as the sum of the height of the protrusion 31 and the minute projection 32 is formed along the circumferential portion of the upper surface 21a so as to be continuous with the circumferential portion in order to prevent a cooling gas, such as He, from leaking out.

In the electrostatic chuck, when the flat substrate W is loaded on the top surfaces 32a of the minute projections 32 and a predetermined voltage is applied to the internal electrode 23, an electrostatic force is generated therebetween to fix the flat substrate W on the minute projections 32a.

Next, components of the electrostatic chuck will be described in detail below.

The area of each of the protrusions 31 in the upper surface 21a is preferably equal to or smaller than 20 mm$^2$, and more preferably, equal to or larger than 3 mm$^2$ and equal to or smaller than 15 mm$^2$.

When the area of the protrusion 31 on the upper surface 21a is larger than 20 mm$^2$, the flat substrate W is deformed during the attachment and detachment of the flat substrate, and the flat substrate W contacts with the circumferential portion of the protrusion 31, which causes the amount of foreign materials attached to the flat substrate W to increase. When a cooling gas, such as He, is introduced into the gap between the flat substrate W and the electrostatic attraction surface of the electrostatic chuck, a temperature difference occurs between a portion of the flat substrate W coming into contact with the protrusions 31 and the other portions of the flat substrate W.

When the upper surface 21a of the dielectric plate 21 is used as the electrostatic attraction surface, the total area of the mounting surfaces of the minute projections 32 on the electrostatic attraction surface is preferably equal to or larger than 0.01% and equal to or smaller than 2% of the area of the electrostatic attraction surface, and more preferably, equal to or larger than 0.05% and equal to or smaller than 0.6% of the area of the electrostatic attraction surface.

When the total area of the mounting surfaces of the minute projections 32 is equal to or larger than 0.01% and equal to or smaller than 2% of the area of the electrostatic attraction surface, a sufficient electrostatic attraction force is not obtained, and contact pressure between the minute projections 32 and the flat substrate W increases. As a result, the minute projections 32 are likely to be worn away and to be damaged, which results in the occurrence of particles.

Meanwhile, when the total area of the mounting surfaces of the minute projections 32 is larger than 2% of the area of the electrostatic attraction surface, with an increase in a contact area between the minute projections 32 and the flat substrate W, the ratio of the thermal conductivity due to the contact between the minute projections 32 and the flat substrate W to the thermal conductivity between the flat substrate W and the electrostatic attraction surface of the electrostatic chuck increases, and the ratio of the thermal conductivity due to the cooling gas introduced into the gap between the electrostatic attraction surface and the flat substrate W to the thermal conductivity between the flat substrate W and the electrostatic attraction surface of the electrostatic chuck decreases, which causes the temperature control characteristics of the flat substrate to be lowered due to the pressure of the cooling gas and the control of a flow rate.

When the temperature control characteristics of the flat substrate are lowered, it is difficult to control the temperature of the flat substrate W in a wide temperature range.

The area of the mounting surface of the minute projection 32 is preferably equal to or larger than $2\times10^{-3}$ mm$^2$ and equal to or smaller than 0.8 mm$^2$, and more preferably, equal to or larger than $8\times10^{-3}$ mm$^2$ and equal to or smaller than $7\times10^{-2}$ mm$^2$.

When the area of the mounting surface of the minute projection 32 is smaller than $2\times10^{-3}$ mm$^2$, the minute projection 32 is worn away due to the flat substrate W. In particular, when a waferless dry-cleaning process is performed on the electrostatic attraction surface, a long processing time is required, and the side of the minute projection 32 is mainly etched by plasma. As a result, the minute projection 32 is worn out, and a large variation occurs in the surface of the minute projection 32 facing the flat substrate W over time, which results in a variation in the thermal characteristics of the electrostatic chuck. On the other hand, when the area of the mounting surface of the minute projection 32 is larger than 0.8 mm$^2$, a difference in thermal conductivity occurs between flat portions 35 formed among the minute projections 32, so that a local temperature difference occurs in the flat substrate W.

Even when the electrostatic attraction surface of the dielectric plate 21 is directly exposed to plasma during the waferless dry-cleaning process and thus accumulated time of wafer dry-cleaning is lengthened, little variation occurs in the roughness of the surface of the minute projection 32. Therefore, thermal conductivity between the flat substrate W and the minute projections 32 does not vary, which makes it possible to perform each flat substrate W under the same condition. Thus, no problem arises even when the waferless dry-cleaning process is repeatedly performed.

The height of the minute projection 32 from the top surface 31a of the protrusion 31 is preferably equal to or larger than 1 μm and equal to or smaller than 10 μm, and more preferably, equal to or larger than 3 μm and equal to or smaller than 6 μm.

When the height of the minute projection 32 is smaller than 1 μm, the height of the minute projection 32 is reduced due to abrasion of the minute projection 32 and the flat substrate W. Meanwhile, when the height of the minute projection 32 is larger than 10 μm, an electrostatic attraction force is weakened, which results in an increase in manufacturing costs.

The height of the minute projection 32 from the upper surface 21a, that is, the sum of the height of the minute projection 32 and the height of the protrusion 31 is preferably equal to or larger than 10 μm and equal to or smaller than 60 μm, and more preferably, equal to or larger than 30 μm and equal to or smaller than 45 μm.

When the height of the minute projection 32 from the upper surface 21a is smaller than 10 μm, the flat substrate W is likely to come into contact with the upper surface 21a. Meanwhile, when the height of the minute projection 32 from the upper surface 21a is larger than 60 μm, there is concern that the electrostatic attraction force will be lowered.

Considering the cooling effects by a cooling gas, such as He, the height of the minute projection 32 from the upper surface 21a is preferably equal to or larger than 30 μm and equal to or smaller than 45 μm, which makes it possible to obtain a uniform cooling gas and thus to make the internal temperature of the flat substrate W constant.

The area of the mounting surfaces of the minute projections 32 is preferably equal to or larger than 0.05% and equal to or smaller than 50% of the area of the protrusions 31, each having the minute projections 32 thereon, in the upper surface 21a, and more preferably, equal to or larger than 0.1% and equal to or smaller than 2% of the area of the protrusions 31 in the upper surface 21a.

In the electrostatic chuck, when the area of the mounting surfaces of the minute projections 32 is smaller than 0.05% of the area of the protrusions 31 in the upper surface 21a, contact pressure between the minute projections 32 and the flat substrate W increases, which causes the minute projections 32 and the flat substrate W to be worn away and to be scratched. As a result, particles are likely to occur. Meanwhile, when the area of the mounting surfaces of the minute projections 32 is larger than 50% of the area of the protrusions 31 in the upper surface 21a, it is difficult to control the temperature of the flat substrate W using cooling gas pressure, and thus thermal conductivity between the electrostatic chuck and the flat substrate W is lowered due to foreign materials adhered to the minute projections 32, which makes it difficult to obtain a sufficient effect from the minute projections 32.

The centerline average (Ra) of the top surface 32a of the minute projection 32 is preferably equal to or larger than 0.001 μm and equal to or smaller than 0.3 μm, and more preferably, equal to or larger than 0.001 μm and equal to or smaller than 0.1 μm. In addition, the curvature radius R of the curved portion 32b is preferably equal to or larger than 0.5 μm and equal to or smaller than 5 μm, and more preferably, equal to or larger than 1 μm and equal to or smaller than 2 μm.

In each minute projection 32, when Ra of the top surface 32 is equal to or larger than 0.001 μm and equal to or smaller than 0.3 μm, the contact between the minute projections and the flat substrate W prevents the flat substrate W from being damaged, and prevents the surface roughness of the top surface 31a of the protrusion 31 from varying due to the positional deviation between the minute projections 32 and the flat substrate W, which makes it possible to prevent thermal conductivity from varying between the flat substrate W and the top surfaces 32a of the minute projections 32, which are the mounting surfaces on which the flat substrate W is loaded. In addition, when the curvature radius R of the curved portion 32b is equal to or larger than 0.5 μm and equal to or smaller than 5 μm, it is possible to prevent the outer circumferential portion of the minute projection 32 from chipping off, the flat substrate W from being damaged due to contact with the minute projection, and particles from occurring.

The total area of the protrusions 31 on the upper surface 21a is preferably equal to or larger than 15% and equal to or smaller than 60% of the area of the electrostatic attraction surface, which is the upper surface 21a, and more preferably, equal to or larger than 20% and equal to or smaller than 40% of the area of the upper surface 21a.

When the total area of the protrusions 31a is equal to or larger than 15% and equal to or smaller than 60% of the area of the upper surface 21a, it is possible to rapidly fill up a cooling gas into the gap between the body 12 and the flat substrate W, and thus to prevent a variation in temperature due to a difference in the pressure distribution of the cooling gas on the upper surface 21a. On the other hand, when the total area of the protrusions 31a is smaller than 15% of the area of the upper surface 21a, it is difficult to obtain a sufficient electrostatic attraction force. When the total area of the protrusions 31a is larger than 60% of the area of the upper surface 21a, a difference in the pressure distribution of the cooling gas on the electrostatic attraction surface occurs.

The dielectric plate 21, the protrusions 31, and the minute projections 32 are formed of ceramics.

For example, the dielectric plate 21, the protrusions 31, and the minute projections 32 may be formed of ceramics formed of one of an aluminum nitride, an aluminum oxide, a silicon nitride, a zirconium oxide, sialon, a boron nitride, and silicon carbide, or composite ceramics formed of two or more of them.

In addition, the dielectric plate 21, the protrusions 31, and the minute projections 32 may be formed of a single material or a compound whose thermal expansion coefficient is approximate to that of the internal electrode 23 and which can be easily sintered. Since the upper surface 21a of the dielectric plate 21 serves as the electrostatic attraction surface, the dielectric plate 21 may be formed of a material having a high dielectric constant and high purity with respect to the flat substrate W that is attracted to the upper surface 21a by an electrostatic force.

Considering the above, the dielectric plate 21, the protrusions 31, and the minute projections 32 may be formed of a composite sintered material of silicon carbide and aluminum oxide that includes equal to or larger than 1% by weight and equal to or smaller than 12% by weight of silicon carbide and the remaining amount of aluminum oxide.

Since the composite sintered material of silicon carbide and aluminum oxide has a volume resistivity value of equal to or larger than $1\times10^8$ Ω·cm and equal to or smaller than $1\times10^{15}$ Ω·cm at room temperature (25° C.), it is suitable for an insulating member (dielectric plate) of the electrostatic chuck, and has high plasma resistance.

When the content of silicon carbide in the composite sintered material of silicon carbide and aluminum oxide is smaller than 1% by weight, the average diameter of aluminum oxide particles contained in the dielectric plate 21 is larger than 2 μm, and aluminum oxide particles having a large diameter are likely to be subjected to plasma etching. Meanwhile, when the content of silicon carbide in the composite sintered material of silicon carbide and aluminum oxide is larger than 12% by weight, the volume resistivity value of the dielectric plate 21 is smaller than $1\times10^8$ Ω·cm, which is not preferable for the electrostatic chuck.

A small amount of impurity is allowable in the composite sintered material. However, if a metal impurity other than aluminum (Al) and silicon (Si) is larger than 0.1% by weight, the metal impurity is more likely to contaminate a flat substrate, such as a wafer, and the temperature dependence of electric resistance increases, which is not preferable.

Further, the average diameter of silicon carbide particles in the composite sintered material of silicon carbide and aluminum oxide is preferably equal to or smaller than 0.2 μm.

When the average diameter of silicon carbide particles is larger than 0.2 μm, an electric field is concentrated on the silicon carbide particles of the composite sintered material of silicon carbide and aluminum oxide during radiation of plasma, so that the silicon carbide particles are likely to be damaged.

Furthermore, the average diameter of aluminum oxide particles in the composite sintered material of silicon carbide and aluminum oxide is preferably equal to or smaller than 2 μm.

When the average diameter of aluminum oxide particles is larger than 2 μm, the composite sintered material of silicon carbide and aluminum oxide is subjected to plasma etching, and sputtering marks are likely to be formed, which results in an increase in the surface roughness.

In the electrostatic chuck having the above-mentioned structural and composite characteristics according to this embodiment, an electrostatic attraction force per unit area coming into contact with the flat substrate W is approximately 300 times stronger than that of the electrostatic chuck according to the related art.

The reason the electrostatic chuck according to this embodiment has a sufficient electrostatic attraction force although the total area of the mounting surfaces of the minute projections 32, which are contact surfaces with the flat substrate W, is equal to or larger than 0.01% and equal to or smaller than 2% of the electrostatic attraction surface, that is, the area of the upper surface 21*a*, is as follows.

Specifically, an aluminum oxide sintered material containing silicon carbide has a higher dielectric constant than an aluminum oxide sintered material not containing the silicon carbide. For example, a general aluminum oxide sintered material has a dielectric constant of approximately 7, but the aluminum oxide sintered material containing silicon carbide has a dielectric constant of approximately 10 to 17. Therefore, in the electrostatic chuck according to this embodiment, Coulomb force is predominant as the electrostatic attraction force.

In the Coulomb-force-type electrostatic chuck, when a narrow gap occurs between the flat substrate W and the dielectric plate 21, the electrostatic attraction force is effectively applied to the flat substrate W through the gap. In the electrostatic chuck according to this embodiment, the electrostatic attraction force is effectively applied between the flat substrate W and the top surfaces 31*a* of the protrusions 31 other than the minute projections 32.

All of the dielectric plate 21, the protrusions 31, and the minute projections 32 are not necessarily formed of the composite sintered material of silicon carbide and aluminum oxide that includes equal to or larger than 1% by weight and equal to or smaller than 12% by weight of silicon carbide and the remaining amount of aluminum oxide. For example, only the protrusions 31 and the minute projections 32 may be formed of the composite sintered material of silicon carbide and aluminum oxide that includes equal to or larger than 1% by weight and equal to or smaller than 12% by weight of silicon carbide.

The insulating member 22 may be formed of a material different from that forming the dielectric plate 21, or it may be formed of a composite sintered material, similar to the dielectric plate 21. When the insulating member 22 is formed of the composite sintered material similar to the dielectric plate 21, the insulating member 22 has high corrosion resistance to halogen gas or plasma, high rigidity and hardness, high heat resistance, and high thermal shock resistance, and the use of the insulating member 22 makes it possible to simplify a process of manufacturing the electrostatic chuck.

Next, a method of manufacturing the electrostatic chuck according to this embodiment will be described below.

In this embodiment, in the following description, the dielectric plate 21, the insulating member 22, the protrusions 31, and the minute projections 32 are formed of a composite sintered material of silicon carbide and aluminum oxide that includes equal to or larger than 1% by weight and equal to or smaller than 12% by weight of silicon carbide.

Silicon carbide powder having an average diameter of 0.1 μm or less may be used as raw material powder.

When the average diameter of the silicon carbide powder is larger than 0.1 μm, the average diameter of silicon carbide particles in the obtained composite sintered material of silicon carbide and aluminum oxide becomes larger than 0.2 μm, which makes it difficult to improve the solidity of the dielectric plate 21 and the insulating member 22.

When the dielectric plate 21 formed of the composite sintered material of silicon carbide and aluminum oxide is exposed to plasma, an electric field concentrates on the silicon carbide particles, so that the dielectric plate 21 is likely to be damaged and has low plasma resistance. In addition, after the dielectric plate 21 is damaged due to plasma, the electrostatic attraction force may be lowered.

Powder obtained by a plasma CVD method may be used as the silicon carbide powder. In particular, fine powder that is obtained by introducing a raw material gas, such as a silane compound, silicon halide, or hydrocarbon, in the non-oxidation atmosphere of plasma and by reacting the materials in a pressure range of less than $1 \times 10^5$ Pa (1 atm) to $1.33 \times 10$ Pa (0.1 Torr) and has an average diameter of 0.1 μm or less has a high degree of sintering and a high degree of purity. In addition, since the fine powder is composed of particles having a circular shape, the fine powder has high dispersibility during shaping. Therefore, the fine powder is preferable.

Meanwhile, aluminum oxide powder composed of particles having an average diameter of 1 μm or less may be used as raw material powder of aluminum oxide particles.

The reason is as follows. In a composite sintered material of silicon carbide and aluminum oxide that is obtained using aluminum oxide powder composed of particles having an average diameter of 1 μm or more, since the average diameter of aluminum oxide particles in the composite sintered material is larger than 2 μm, the upper surface 21*a* of the dielectric plate 21 on which a flat substrate is loaded is likely to be etched by plasma, so that sputtering scratches are formed in the upper surface 21*a*. As a result, the surface roughness of the upper surface 21*a* increases, which may cause the electrostatic attraction force of the electrostatic chuck 11 to be lowered.

Any aluminum oxide power may be used as long as the average diameter of particles is equal to or smaller than 1 μm and aluminum oxide power has a high degree of purity.

Next, the silicon carbide powder and the aluminum oxide powder are weighed such that the silicon carbide power has equal to or larger than 1 and equal to or smaller than 12% by weight and the aluminum oxide powder has the remaining amount, and they are mixed.

Then, the mixed powder is molded into a predetermined shape, and the mold is baked while being pressed by, for example, a hot press (HP) to obtain a composite sintered material of silicon carbide and aluminum oxide.

The hot press is pressed at a pressure of, for example, 5 to 40 MPa to obtain a composite sintered material of silicon carbide and aluminum oxide. However, the pressure is not limited thereto. When the pressure is lower than 5 MPa, a composite sintered material having sufficient sintering density is not obtained. Meanwhile, when the pressure is larger than 40 MPa, a jig formed of, for example, graphite is deformed and damaged.

A baking temperature is preferably in the range of 1650 to 1850° C. When the baking temperature is lower than 1650° C., a composite sintered material having sufficient density is not obtained. When the baking temperature is higher than 1850° C., a sintered material may be decomposed or grain growth may occur in the sintered material during baking.

Further, the baking is preferably performed in an inert gas atmosphere, such as an argon atmosphere or a nitrogen atmosphere, in order to prevent the oxidation of silicon carbide.

The electrode insertion hole 27 is formed by machining at a predetermined position of one of two composite sintered materials, each composed of silicon carbide and aluminum oxide, obtained in this way, thereby forming the insulating member 22.

In addition, paste containing conductive fillers is applied into a region in which the internal electrode of the insulating member 22 will be formed to form a conductive layer, and paste containing insulating fillers is applied outside the region having the conductive layer formed therein to form an insulating layer.

Meanwhile, the surface of the other composite sintered material is polished into a flat surface such that Ra (centerline average roughness) is equal to or smaller than 0.3 μm, thereby forming the dielectric plate 21.

Then, the lead electrode 28 is inserted into the electrode insertion hole 27 such that the surface of the insulating member 22 having the conductive layer and the insulating layer formed thereon overlap one surface of the dielectric plate 21 that is not polished so as to be opposite thereto. Subsequently, pressure is applied to the dielectric plate 21 and the insulating member 22 while heating them at a temperature of, for example, 1600° C. or more to form the internal electrode 23 by using the conductive layer and to form the insulating member 24, serving as an adhesive layer, by using the insulating layer. Then, the dielectric plate 21 and the insulating member 22 are bonded to each other with the internal electrode 23 and the insulating member 24 interposed therebetween.

The protrusions 31, the minute projections 32, and the wall portion 33 can be formed by machining, such as grinding or laser carving, or blasting.

Next, a manufacturing method using blasting will be described below with reference to FIGS. 5A to 5E.

Figure 5A:
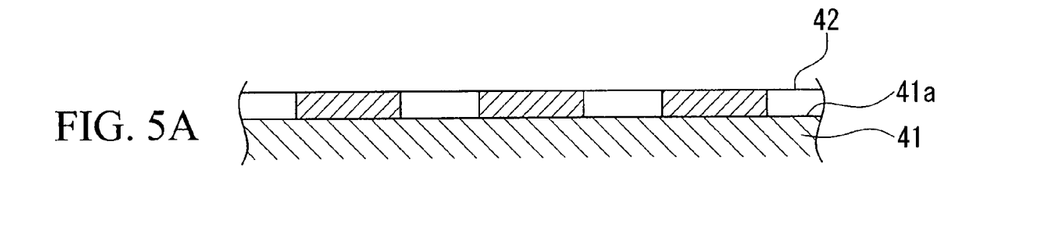
FIGS. 5A to 5E are diagrams illustrating a method of manufacturing a composite sintered product according to the first embodiment of the invention using a plasma processing method.

First, as shown in FIG. 5A, the flat surface of a composite sintered product 41 of silicon carbide and aluminum oxide, which is a surface on which a flat substrate is loaded, is polished again such that a surface 41a has Ra (centerline average roughness) in the range of 0.001 to 0.3 μm, and the surface 41a is degreased and cleaned.

The degreasing process is performed using an organic solvent, such as acetone, methanol, ethanol, or 2-propanol to remove grease. Thereafter, cleaning using hot water is performed.

After the cleaning, a mask 42 having a predetermined pattern is put on the surface 41a. The pattern of the mask 42 is the same as the pattern of the protrusions 31 shown in FIGS. 1 to 3. A flat mask formed of, for example, a photosensitive resin (resist) that is photosensitive to ultraviolet rays or visible rays or a metallic material is used as the mask 42.

Figure 5B:
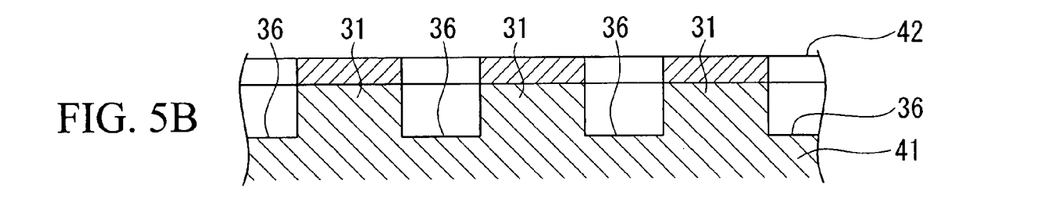

Then, blasting is performed on the surface 41a of the composite sintered product 41 using the mask 42. As shown in FIG. 5B, portions of the composite sintered product covered with the mask 42 remain as the protrusions 31, and the other portions (exposed portions) of the composite sintered product not covered with the mask 42 are removed and serve as flat portions 36.

Alumina particles, silicon carbide particles, or glass beads are used for the blasting. The diameter of the particles is preferably in the range of 8.5 μm to 60 μm, and the cumulative percentage of the particles is 50% (D50) in a particle size distribution.

Figure 5C:
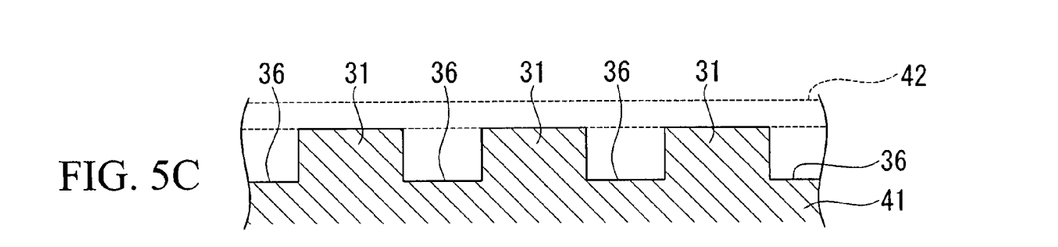

Then, as shown in FIG. 5C, the mask 42 is removed. When the mask 42 is formed of a photosensitive resin, a peeling agent, such as methylene chloride, is used.

In this way, the protrusions 31 and the flat portions 36 are simultaneously formed on the surface 41a of the composite sintered product 41 of silicon carbide and aluminum oxide.

Figure 5D:
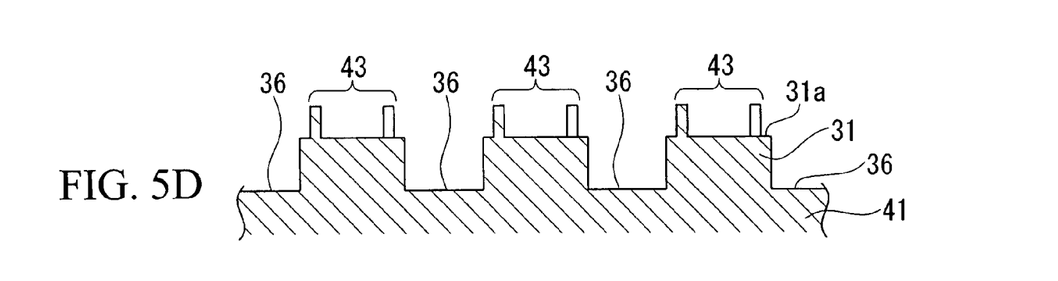

Then, as shown in FIG. 5D, a mask is put on the top surfaces 31a of the protrusions 31. The pattern of the mask 43 is the same as the pattern of the minute projections 32.

A flat mask formed of, for example, a photosensitive resin (resist) that is photosensitive to ultraviolet rays or visible rays or a metallic material is used as the mask 43.

Figure 5E:
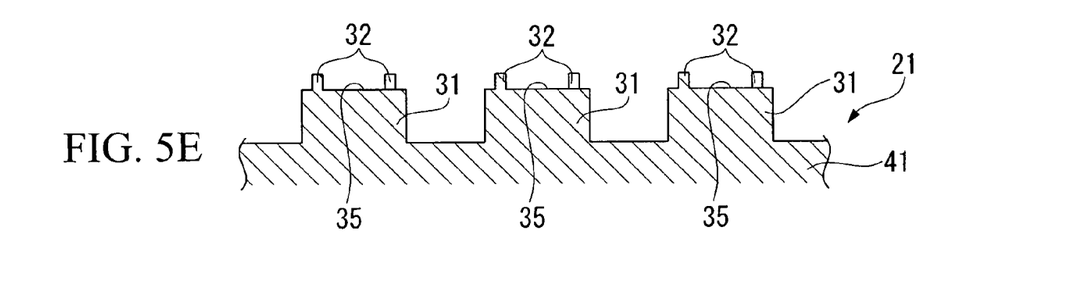

Then, blasting is performed on the top surfaces 31a of the protrusions 31 using the mask 43. As shown in FIG. 5E, portions of the top surfaces 31a covered with the mask 43 remain as the minute projections 32, and the other portions of the top surfaces 31a not covered with the mask 43 are removed and serve as flat portions 35.

In this case, it is preferable that the flat portions 36 be covered with an organic polymer (resist) having high blast resistance such that the flat portions 36 are not removed by blasting.

The diameter of particles used for the blasting is preferably in the range of approximately 6 μm to 17 μm, and the cumulative percentage of the particles is 50% (D50) in the particle size distribution.

Then, a degreasing process is performed on the composite sintered product 41 having the protrusions 31 and the minute projections 32 formed thereon. The degreasing is performed using an organic solvent, such as acetone, methanol, ethanol, or 2-propanol. Thereafter, cleaning using hot water is performed.

In this way, the protrusions 31 and the minute projections 32 are formed on the surface of the composite sintered product 41.

Then, the temperature adjusting base member 14 is bonded to the lower surface of the body 12 by the silicon resin adhesive 13 to manufacture the electrostatic chuck according to this embodiment.

As described above, according to the electrostatic chuck of this embodiment, a plurality of protrusions 31 are provided on the upper surface 21a of the dielectric plate 21 forming the base 12, and one or more minute projections 32 are provided on each of the top surfaces of some or all of the protrusions 31. The top surfaces 32a of the minute projections 32 are used as the mounting surfaces on which the flat substrate W is loaded, and the total area of the top surfaces 32a is equal to or larger than 0.01% of the area of the upper surface 21a (the electrostatic attraction surface) and equal to or smaller than 2% of the area of the upper surface 21a. Therefore, even when the flat substrate W is repeatedly loaded on the top surfaces 32a and the time required to perform a waferless dry-cleaning process is lengthened, it is possible to prevent thermal conductivity between the dielectric plate 21 and the flat substrate W from varying over time, and it is easy to control the temperature of the flat substrate W to a predetermined temperature. As a result, it is possible to accurately control the temperature of the flat substrate W.

Second Embodiment

Figure 6:
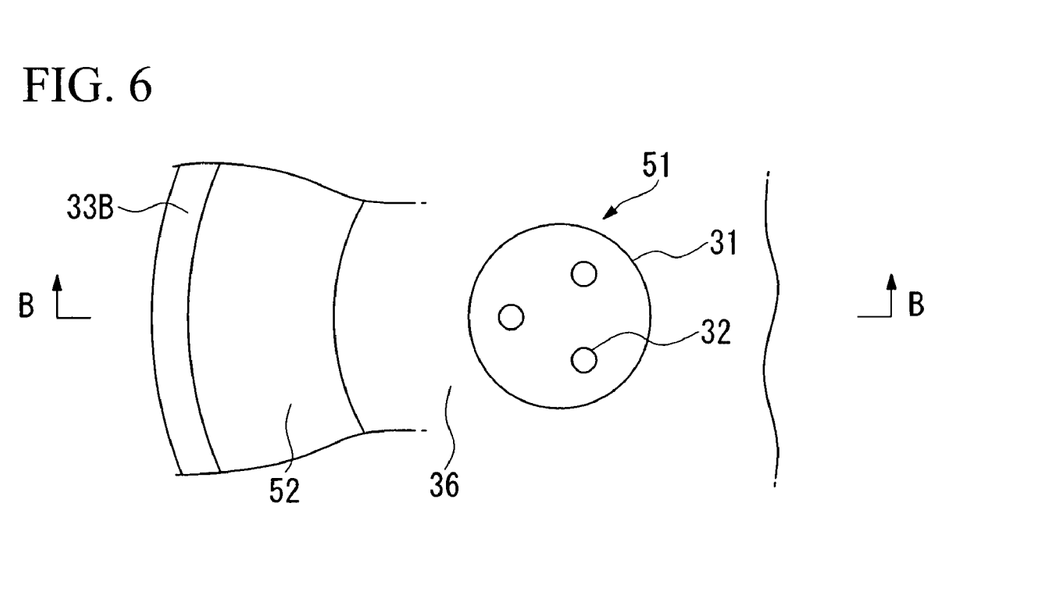
FIG. 6 is a plan view illustrating the vicinity of a circumferential portion of an electrostatic chuck according to a second embodiment of the invention.
Figure 7:
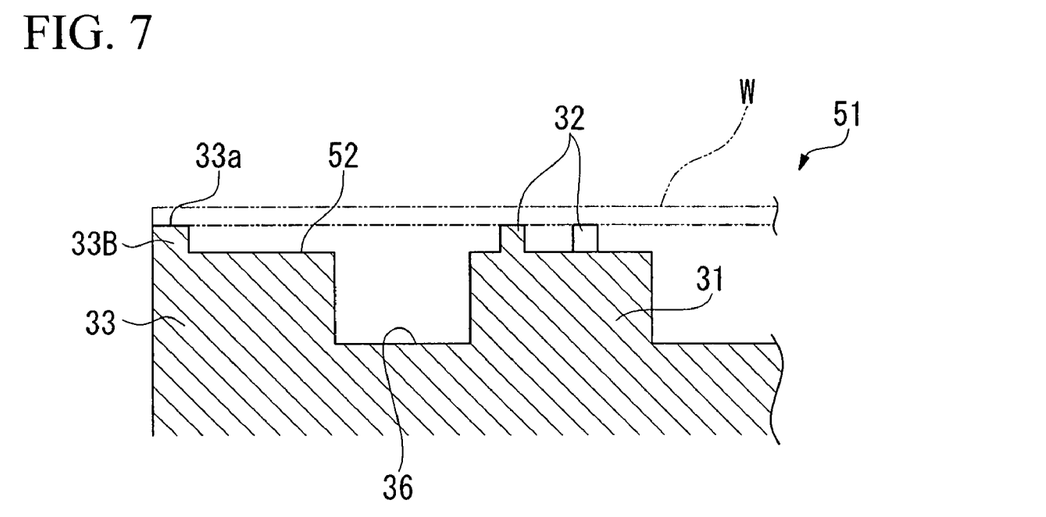
FIG. 7 is a cross-sectional view taken along the line VII-VII of FIG. 6.

FIG. 6 is a plan view illustrating the vicinity of a circumferential portion of an electrostatic chuck according to a second embodiment of the invention, and FIG. 7 is a cross-sectional view taken along the line VII-VII of FIG. 6. An electrostatic chuck 51 according to the second embodiment differs from the electrostatic chuck 11 according to the first embodiment in that a step portion 52 having a rectangular shape in sectional view is formed along the circumference of the wall portion 33 inside a top surface 33a of the wall portion 33, a flat substrate W is loaded on the top surface of a ring-shaped wall portion 33B, and the step portion 52 and the wall portion 33B control the flow of a cooling gas, such as He.

The width of the wall portion 33B is in the range of 10 μm to 50 μm, and the height thereof is in the range of 1 μm to 10 μm.

When the width of the wall portion 33B is smaller than 10 μm, the time required to perform a waferless dry-cleaning process is lengthened, which causes the corner of the wall portion 33B to be worn away and the sealing of a cooling gas to be considerably lowered. In addition, in this case, the wall portion 33B may be damaged during machining, and manufacturing costs increase. When the width of the wall portion 33B is larger than 50 μm, the state of the top surface 33a of the wall portion 33B varies, and it is difficult to prevent a variation in contact thermal conductivity over time.

According to this embodiment, since the step portion 52 is formed in the electrostatic chuck 51, it is possible to accurately control the temperature of the flat substrate W in the vicinity of the wall portion 33B.

Third Embodiment

Figure 8:
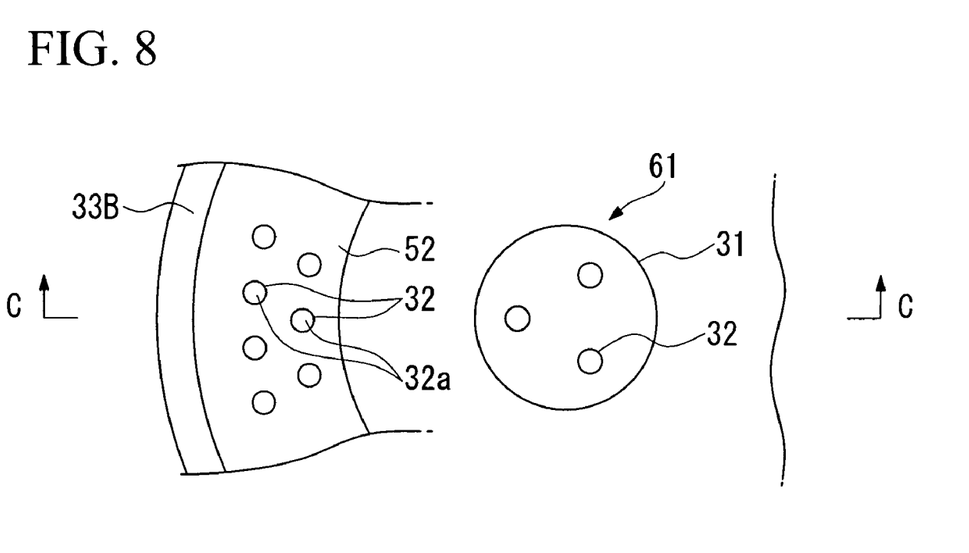
FIG. 8 is a plan view illustrating the vicinity of a circumferential portion of an electrostatic chuck according to a third embodiment of the invention.
Figure 9:
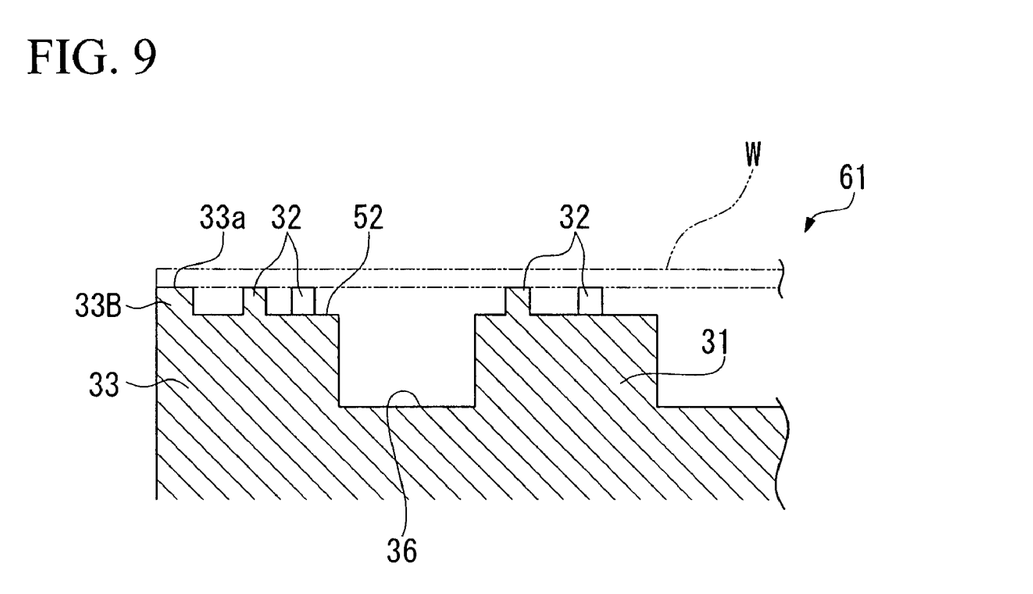
FIG. 9 is a cross-sectional view taken along the line IX-IX of FIG. 8.

FIG. 8 is a plan view illustrating the vicinity of a circumferential portion of an electrostatic chuck according to a third embodiment of the invention, and FIG. 9 is a cross-sectional view taken along the line IX-IX of FIG. 8. An electrostatic chuck 61 according to the third embodiment differs from the electrostatic chuck 51 according to the second embodiment in that a plurality of minute projections 32 are provided on the step portion 52, a flat substrate W is loaded on the top surface of a ring-shaped wall portion 33B and the top surfaces 32a of the minute projections 32, and the step portion 52 and the wall portion 33B control the flow of a cooling gas such as He.

The sectional area of the minute projection 32 is preferably equal to or larger than $8 \times 10^{-5}$ mm$^2$ and equal to or smaller than $2 \times 10^{-3}$ mm$^2$.

The electrostatic chuck 61 according to this embodiment can achieve the same effects as the electrostatic chuck 51 according to the second embodiment.

In particular, since a plurality of minute projections 32 are provided on the step portion 52, it is possible to ensure a sufficient electrostatic attraction force.

Fourth Embodiment

Figure 10:
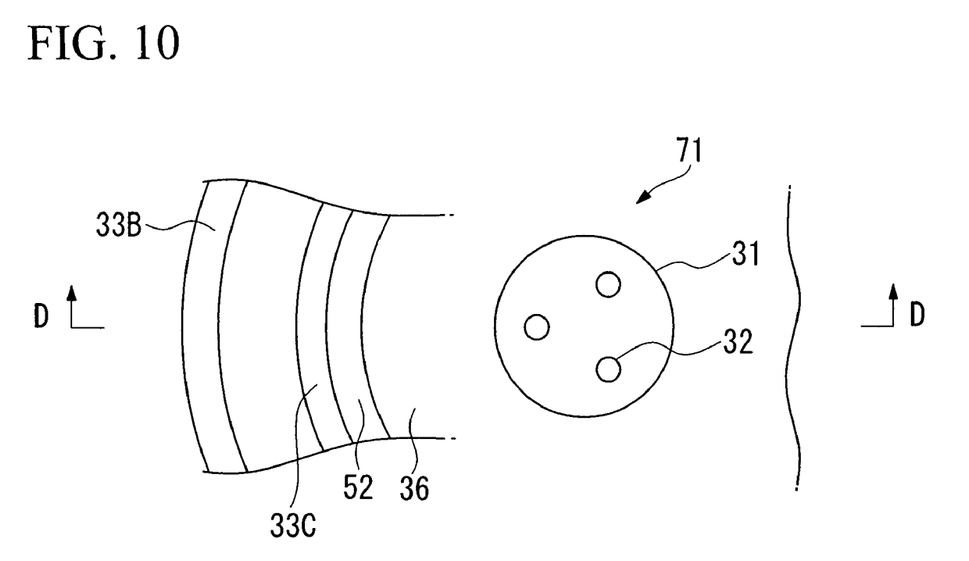
FIG. 10 is a plan view illustrating the vicinity of a circumferential portion of an electrostatic chuck according to a fourth embodiment of the invention.
Figure 11:
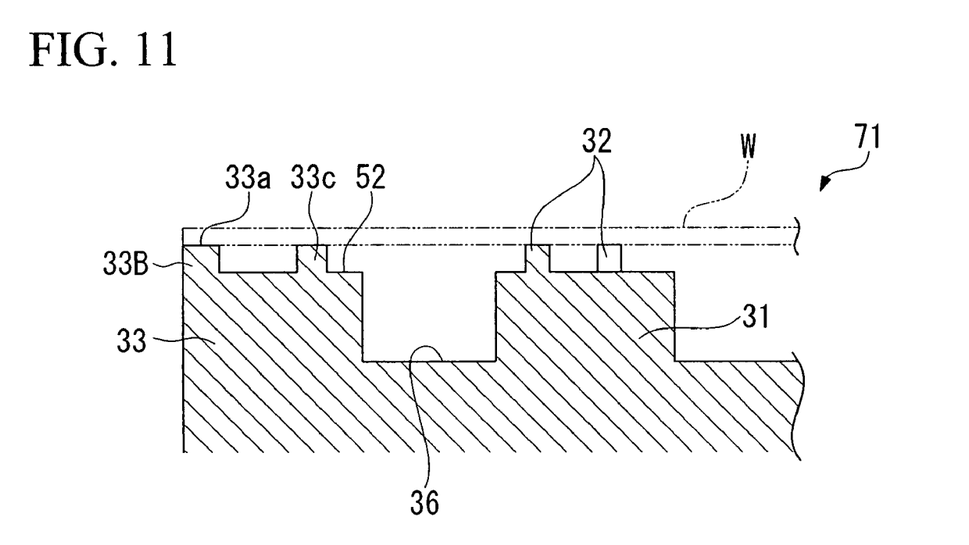
FIG. 11 is a cross-sectional view taken along the line XI-XI of FIG. 10.

FIG. 10 is a plan view illustrating the vicinity of a circumferential portion of an electrostatic chuck according to a fourth embodiment of the invention, and FIG. 11 is a cross-sectional view taken along the line XI-XI of FIG. 10. An electrostatic chuck 71 according to the fourth embodiment differs from the electrostatic chuck 51 according to the second embodiment in that a ring-shaped wall portion 33C having the same center as the wall portion 33B is formed on the step portion 52 along the circumferential direction of the step portion, a flat substrate W is loaded on the top surfaces of ring-shaped wall portions 33B and 33C and the top surfaces 32a of the minute projections 32, and the step portion 52 and the wall portions 33B and 33C control the flow of a cooling gas such as He.

The height of the wall portion 33C from the step portion 52 is preferably equal to or larger than 1 μm and equal to or smaller than 10 μm, and the width of the wall portion 33C is preferably equal to or larger than 10 μm and equal to or smaller than 50 μm.

The electrostatic chuck 71 according to this embodiment can achieve the same effects as the electrostatic chuck 51 according to the second embodiment.

In particular, since the ring-shaped wall portion 33C having the same center as the wall portion 33B is on the step portion 52 along the circumferential direction of the step portion 52, it is possible to ensure a sufficient electrostatic attraction force.

EXAMPLES

Next, examples according to the invention and comparative examples will be described in detail below. In these examples, the electrostatic chuck according to the fourth embodiment, that is, the electrostatic chuck 71 shown in FIGS. 10 and 11 is manufactured. However, one minute projection 32 is formed on the top surface 31a of the protrusion 31.

Example 1

(Manufacture of Electrostatic Chuck)

Fine silicon carbide particles having an average diameter of 0.06 μm are synthesized by a plasma CVD method, and the fine silicon carbide particles and aluminum oxide power having an average diameter of 0.15 μm are weighed such that the ratio of the weight of silicon carbide particles to the weight of aluminum oxide powder is 9:91. Then, the fine silicon carbide particles are mixed with the aluminum oxide power.

The mixed powder is molded into a disk by using a powder molding machine, and the molded powder is baked while being pressed by a hot press (HP) in an argon atmosphere at a temperature of 1800° C. for four hours to manufacture two disk-shaped composite sintered products having a diameter of 320 mm and a thickness of 5 mm. In this case, a pressure of 40 MPa is applied to the molded powder.

Then, the average diameters of the silicon carbide particles and the aluminum oxide particles in the obtained composite sintered product are measured by a scanning electron microscope (SEM). As the measured result, the average diameter of the silicon carbide particles is 0.07 μm, and the average diameter of the aluminum oxide particles is 0.08 μm. In addition, the volume resistivity value of the composite sintered product is measured at a temperature of 20° C. where the electrostatic chuck is used. As the measured result, the volume resistivity value of the composite sintered product is $2 \times 10^{15}$ Ω·cm.

Then, one of the two composite sintered products is machined to have a diameter of 320 mm and a thickness of 4 mm. In addition, the electrode insertion hole 27 having an inside diameter of 5 mm is formed at a position separated from the center of the composite sintered product by 100 mm and the cooling gas introduction hole 29 having an inside diameter of 3 mm is formed at a position separated from the center of the composite sintered product by 120 mm by machining, thereby forming the insulating member 22.

Further, conductive paste (paste including conductive fillers) is applied into a region in which the internal electrode of the insulating member 22 is formed (a region within a radius of 145 mm from the center) by a screen printing method to form a conductive layer.

The conductive paste is obtained by weighing molybdenum carbide powder and aluminum oxide powder such that the ratio of the volume of the molybdenum carbide powder to the volume of the aluminum oxide powder is 35:65, and adding an organic solvent to mix the molybdenum carbide powder with the aluminum oxide powder.

Further, paste including aluminum oxide powder is applied into a region outside the region in which the conductive layer of the insulating member 22 is formed (a region within a radius of 145 to 149 mm from the center) by a screen printing method to form an insulating layer.

Meanwhile, the surface of the other composite sintered product (the surface on which a flat substrate will be loaded) is polished into a flat surface such that Ra (centerline average roughness) is 0.3 μm, and the cooling gas introduction hole 29 having an inside diameter 3 mm is formed at a position separated from the center of the composite sintered product by 120 mm, thereby forming the dielectric plate 21.

Then, the lead electrode 28 formed of tantalum carbide is inserted into the electrode insertion hole 27, and the surface of the insulating member 22 on which the conductive layer and the insulating layer are formed is opposite to the surface of the dielectric plate 21 that is not polished such that the cooling gas introduction hole 29 passes through the insulating member 22 and the dielectric plate 21. Subsequently, a pressure of 10 MPa is applied to the insulating member 22 and the dielectric plate 21 while heating them at a temperature of 1700° C. to form the internal electrode 23 using the conductive layer and to form the insulating member 24, serving as an adhesive layer, using the insulating layer. Then, the insulating member 22 and the dielectric plate 21 are bonded to each other with the internal electrode 23 and the insulating member 24 interposed therebetween.

Subsequently, the bonded structure is machined such that the outside diameter is 298 mm, the thickness of the insulating member 24 is 1 mm, and the thickness of the dielectric plate 21 is 0.5 mm, and the flat surface (the mounting surface on which a flat substrate is loaded) of the dielectric plate 21 is polished such that Ra (centerline average roughness) is 0.05 μm.

Then, blasting is performed on the bonded structure to form a plurality of protrusions 31 (the area of the protrusion 31 on the upper surface 21a is 4.9 mm$^2$) on the upper surface 21a of the dielectric plate 21 and one minute projection 32 (the area of the mounting surface is 0.008 mm$^2$) on the upper surface 31a of each of the protrusions 31, respectively.

In this example, the total area of the mounting surfaces of the minute projections 32 is 0.05% of the area of the upper surface 21a (electrostatic attraction surface), and the area of the mounting surface of the minute projection 32 is 0.16% of the area of the protrusion 31 on the upper surface 21a. In addition, the total area of the protrusions 31 is 33% of the area of the upper surface 21a (electrostatic attraction surface).

The height of the outer circumferential wall 33 from the flat portion 36 to the top surface is 40 μm, the height of the protrusion 31 from the flat portion 36 is 35 μm, and the height of the minute projection 32 from the top surface 31a is 5 μm.

The temperature adjusting base member 14 that is formed of a metallic material and has a flow path 25 for circulating a cooling medium formed therein is bonded to the lower surface of the body 12 by the silicon-based adhesive 13, thereby manufacturing an electrostatic chuck according to a first example.

(Characteristic Evaluation of Electrostatic Chuck)

The electrostatic chuck is mounted on a plasma etching apparatus, and a silicon wafer having a diameter of 300 mm (12 inches) is loaded on the mounting surface of the electrostatic chuck. Then, a DC voltage of 2500 V is applied to fix the silicon wafer to the electrostatic chuck by an electrostatic attraction force, and a predetermined etching process is performed on the silicon wafer by making an He gas at a predetermined pressure (15 torr) flow into a gap between the silicon wafer and the dielectric plate 21 of the electrostatic chuck through the cooling gas introduction hole 29 in a plasma atmosphere that is generated by an etching gas (a mixed gas of $C_5F_8$ (29 sccm), Ar (750 sccm), and $O_2$ (47 sccm)) at a pressure of 3.3 Pa, while making cooling water at a temperature of 20° C. flow through a flow path 25 of the temperature adjusting base member 14.

In this example, a predetermined waterless dry-cleaning process (WLDC) (processing conditions: $O_2$, 600 sccm) is performed whenever the silicon wafer is processed, and the cumulative time of an etching process is set to 0 and 100 hours. Then, the temperature of the surface of the silicon wafer is measured by supplying an He gas at a predetermined temperature (10 torr and 30 torr) into a gap between the silicon wafer and the dielectric plate 21 of the electrostatic chuck through the cooling gas introduction hole 29 in the plasma atmosphere while making cooling wafer at a temperature of 20° C. flow through the flow path 25 of the temperature adjusting base member 14, and the difference between temperatures is recorded.

Figure 12:
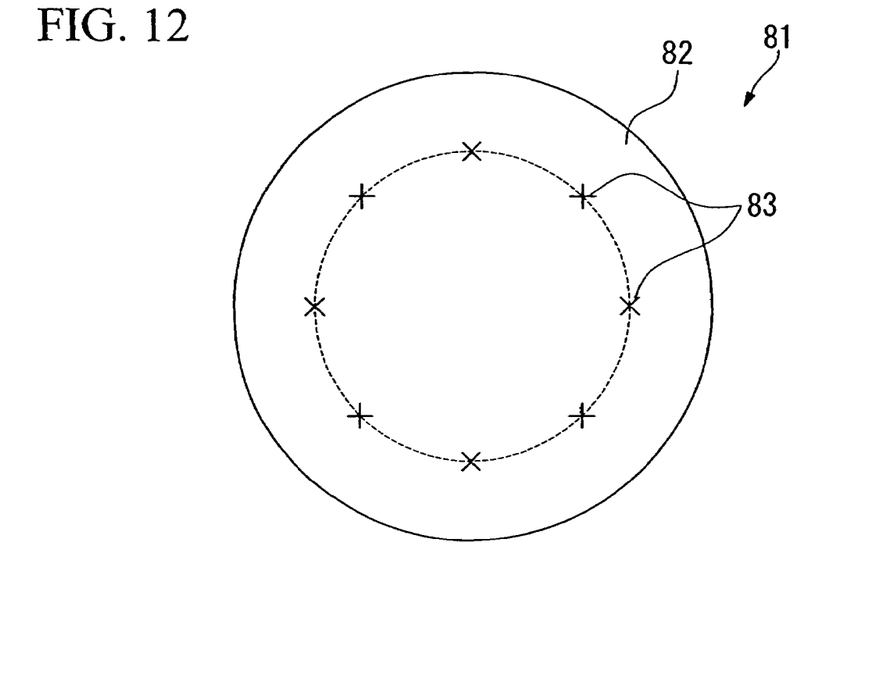
FIG. 12 is a plan view illustrating measurement points where the surface temperature of a silicon wafer is measured.

As shown in FIG. 12, the temperature of the surface 82 of a silicon wafer 81 is measured at measurement points 83 (eight measurement points in FIG. 12) provided at equal distances on the circumference of a radius of 100 mm from the center of the surface 82, and the average of the measured temperatures is used as the surface temperature.

The measured results are shown in Table 1.

Example 2

An electrostatic chuck according to a second example is manufactured by the same method as that in which the electrostatic chuck according to the first example is manufactured.

However, in this example, the area of the protrusion 31 on the upper surface 21a is set to 1.5 mm$^2$, and the area of the mounting surface of the minute projection 32 is set to 0.08 mm$^2$. In addition, the total area of the mounting surfaces of the minute projections 32 is 0.17% of the area of the upper surface 21 (electrostatic attraction surface), and the area of the mounting surface of the minute projection 32 is 0.5% of the area of the protrusion 31 on the upper surface 21a. Further, the total area of the protrusions 31 is 34% of the area of the upper surface 21a (electrostatic attraction surface).

Then, various characteristics of the electrostatic chuck according to the second example are measured and evaluated as compared with the electrostatic chuck according to the first example. The measured results are shown in Table 1.

Example 3

An electrostatic chuck according to a third example is manufactured by the same method as that in which the electrostatic chuck according to the first example is manufactured.

However, in this example, the area of the protrusion 31 on the upper surface 21a is set to 0.2 mm$^2$, and the area of the mounting surface of the minute projection 32 is set to 0.08 mm$^2$. In addition, the total area of the mounting surfaces of the minute projections 32 is 0.59% of the area of the upper surface 21 (electrostatic attraction surface), and the area of the mounting surface of the minute projection 32 is 4.0% of the area of the protrusion 31 on the upper surface 21a. Further, the total area of the protrusions 31 is 15% of the area of the upper surface 21a (electrostatic attraction surface).

Then, various characteristics of the electrostatic chuck according to the third example are measured and evaluated as compared with the electrostatic chuck according to the first example. The measured results are shown in Table 1.

Comparative Example 1

An electrostatic chuck according to a first comparative example is manufactured by the same method as that in which the electrostatic chuck according to the first example is manufactured.

However, in the first comparative example, only the protrusions 31 are formed on the upper surface 21a such that the area of the protrusion 31 is 0.2 mm$^2$, but the minute projections 32 are not formed. Further, the total area of the protrusions 31 is 15% of the area of the upper surface 21a.

Then, various characteristics of the electrostatic chuck according to the first comparative example are measured and evaluated as compared with the electrostatic chuck according to the first example. The measured results are shown in Table 1.

Comparative Example 2

An electrostatic chuck according to a second comparative example is manufactured by the same method as that in which the electrostatic chuck according to the first comparative example is manufactured.

However, in the second comparative example, the surface roughness Ra (centerline average roughness) of the top surface 31a of the protrusion 31 is set to 0.25 μm.

Then, various characteristics of the electrostatic chuck according to the second comparative example are measured and evaluated as compared with the electrostatic chuck according to the first example. The measured results are shown in Table 1.

TABLE 1

|  |  | Example 1 | Example 2 | Example 3 | Comparative Example 1 | Comparative Example 2 |
|---|---|---|---|---|---|---|
| Area ratio of minute protrusion | | 0.05% | 0.17% | 0.59% | | |
| Area ratio of protrusion | | 33% | 34% | 15% | 15% | 15% |
| 0 hour | Difference | 25° C. | 19° C. | 13° C. | 3° C. | 17° C. |
| 100 hours | Difference | 25° C. | — | — | 3° C. | 3° C. |

[Evaluation Result]

The above-mentioned evaluation result shows the following.

(1) Comparison between the comparative example 1 and the examples 1 to 3 shows that a temperature range in which the pressure of a cooling gas can be controlled to keep a flat substrate at a predetermined temperature is widened, which makes it possible to accurately control the temperature of the flat substrate.

(2) Comparison between the comparative example 2 and the example 1 shows that, even when a flat substrate is repeatedly loaded on the electrostatic chuck and the time required to perform a waterless dry-cleaning process is lengthened, it is possible to prevent thermal conductivity between the electrostatic chuck and the flat substrate from varying over time and thus to process each flat substrate under the same condition.

According to the electrostatic chuck of the invention, a plurality of protrusions are formed on the electrostatic attraction surface, and one or more minute projections are formed on each of the top surfaces of some or all of the plurality of protrusions. In addition, a region of the top surface of each minute projection on which the flat substrate is loaded is referred to as a mounting surface, and the total area of the mounting surfaces is equal to or larger than 0.01% and equal to or smaller than 2% of the area of the electrostatic attraction surface. Therefore, even when the flat substrate is repeatedly loaded on the electrostatic chuck and the time required to perform a waferless dry-cleaning process is lengthened, it is possible to prevent thermal conductivity between the electrostatic chuck and the flat substrate from varying over time and thus to process each flat substrate under the same condition.

In addition, a temperature range in which the pressure of a cooling gas can be controlled to keep a flat substrate at a predetermined temperature is widened. Therefore, it is possible to accurately control the temperature of the flat substrate.

Although the invention has been described in connection with the exemplary embodiments of the invention, it will be apparent to those skilled in the art that various modifications and changes can be made without departing from the scope and spirit of the invention. Therefore, it should be understood that the above embodiments are not limitative, but illustrative in all aspects. The scope of the present invention is defined by the appended claims rather than by the description preceding them, and all changes and modifications that fall within the scope of the claims, or equivalences of such scope are therefore intended to be embraced by the claims.

What is claimed is:

1. An electrostatic chuck for attracting a flat substrate by an electrostatic force, the electrostatic chuck comprising:

a body including an internal electrode for attracting the flat substrate by the electrostatic force provided therein, the body further including a first surface serving as an electrostatic attraction surface;

a plurality of protrusions formed on the first surface of the body, each protrusion of the plurality of protrusions having a top surface; and one or more projections positioned on the top surface of each protrusion, and having an outer diameter smaller than the diameter of the protrusion, each of the one or more projections including a mounting surface on which the flat substrate is loaded, wherein a total area of the mounting surfaces of the one or more projections is equal to or larger than 0.01% and equal to or smaller than 2% of the area of the electrostatic attraction surface, a height of each projection of the one or more projections from the top surface of each protrusion is in a range equal to or larger than 3 μm and equal to or smaller than 6 μm, and a sum of a height of a protrusion of the one or more protrusions from the first surface of the body and the height of a projection of the one or more projections is in a range equal to or larger than 30 μm and equal to or smaller than 45 μm.

2. The electrostatic chuck according to claim 1, wherein an area of the mounting surface of each projection is equal to or larger than $2 \times 10^{-3}$ mm$^2$ and equal to or smaller than 0.8 mm$^2$.

3. The electrostatic chuck according to claim 1, wherein an area of the mounting surface of the projection is equal to or larger than 0.05% and equal to or smaller than 50% of the area of the protrusion.

4. The electrostatic chuck according to claim 1, wherein a total area of the plurality of protrusions is equal to or larger than 15% and equal to or smaller than 60% of the area of the electrostatic attraction surface.

5. The electrostatic chuck according to claim 1, the mounting surface of each projection including a curved portion having a curvature radius in a range of equal to or larger than 0.5 μm and equal to or smaller than 5 μm positioned at a circumference of the mounting surface.

6. The electrostatic chuck according to claim 1, wherein the plurality of protrusions and the one or more projections comprise a composite sintered material of aluminum oxide and silicon carbide that includes equal to or larger than 1% by weight and equal to or smaller than 12% by weight of the silicon carbide, the average diameter of particles of the aluminum oxide being equal to or smaller than 2 μm, and the average diameter of particles of the silicon carbide being equal to or smaller than 0.2 μm.

7. The electrostatic chuck according to claim 1, further comprising a wall portion provided in a ring shape along a circumference of the electrostatic attraction surface and including a wall top surface configured together with the mounting surfaces of the one or more projections to receive the flat substrate.

8. The electrostatic chuck according to claim 7, wherein the wall top surface includes a step portion along an inner circumference of the wall portion, wherein the flat substrate is loaded on portions of the wall top surface other than the step portion.

9. The electrostatic chuck according to claim 8, the step portion comprising one or more second projections, each of the one or more second projections including a second top surface positioned and configured to receive the flat substrate.

10. The electrostatic chuck according to claim 8, the step portion comprising a second wall portion positioned in a ring shape along a circumference of the step portion, the second wall portion including a second wall top surface positioned and configured to receive the flat substrate.

11. The electrostatic chuck according to claim 10, wherein a height of the second wall portion from the step portion is in a range of equal to or larger than 1 μm and equal to or smaller than 10 μm.

* * * * *